United States Patent [19]

Matsuura

[11] 4,024,415
[45] May 17, 1977

[54] DETECTING DEVICE FOR DETECTING BATTERY OUTLET VOLTAGE

[76] Inventor: Yoshiaki Matsuura, 14-1, 2-chome, Yashiki, Chiba Narashino, Japan

[22] Filed: Dec. 19, 1975

[21] Appl. No.: 642,339

[30] Foreign Application Priority Data

Dec. 20, 1974  Japan .............................. 49-147279
Dec. 24, 1974  Japan ................................ 49-4090
Dec. 24, 1974  Japan ................................ 49-4091

[52] U.S. Cl. .......................... 307/362; 307/247 A; 307/304; 307/251; 320/48; 340/249; 58/152 H; 58/23 BA
[51] Int. Cl.² .................... H03K 13/18; G04C 5/00
[58] Field of Search ........... 307/235 T, 247 A, 304, 307/251; 340/248 Y, 249; 320/48; 58/23 BA, 152 B, 152 H

[56] References Cited

UNITED STATES PATENTS

| 3,038,110 | 6/1962 | Paist | 340/249 X |
| 3,604,952 | 9/1971 | Regitz | 307/304 X |
| 3,702,943 | 11/1972 | Heuner et al. | 307/235 T |
| 3,862,441 | 1/1975 | Nabetani et al. | 307/304 X |
| 3,877,001 | 4/1975 | Bogut et al. | 340/249 |
| 3,928,846 | 12/1975 | Arai et al. | 58/152 H |

Primary Examiner—John S. Heyman
Attorney, Agent, or Firm—Robert E. Burns; Emmanuel J. Lobato; Bruce L. Adams

[57] ABSTRACT

A detecting device for detecting battery output voltage comprises a voltage detector having at least a pair of MOS transistors connected in series such that at least one of said MOS transistors shifts to its conductive state when the battery output voltage falls below a predetermined value to provide one type logic level signal and remains non-conductive when the battery output voltage is above the predetermined value to provide the other type logic signal.

A switching circuit comprised of a complementary MOS inverter receives the output logic signal derived from the voltage detector and switches states in response to the two logic signals to accordingly control the energization of a display element in dependence upon the battery output voltage.

5 Claims, 4 Drawing Figures

DETECTING DEVICE FOR DETECTING BATTERY OUTLET VOLTAGE

BACKGROUND OF THE INVENTION

This invention relates to a detecting device for detecting excessive voltage drop of a battery or cell, in which a predetermined warning voltage is detected in the gradual voltage drop of the battery. For small electronic instruments such as electronic watches, batteries or cells are generally in use as the power source. The battery or cell keeps initially an approximately constant voltage $V_B$ for some long time, as shown in FIG. 1. The subsequent discharge of the battery causes a gradual voltage drop of the battery output. An electronic device generally operates in an unstable manner or stops entirely when it is supplied, for its operation, with a voltage less than a voltage $V_1$ from the power source or battery. For assuring stable operation of the electronic device, it is necessary to detect the battery voltage drop greater than a predetermined voltage and to exchange the battery with a new one before unstable operation begins in the device.

Conventional excessive voltage drop detectors proposed for a battery or cell detect voltage drop in a voltage dividing circuit which consists of a plurality of resistors or of a combination of resistors and condensers. But, it is very difficult to choose resistors or condensers of equal value for the voltage dividing circuit, and, therefore, detecting accuracy of the voltage as the dividing accuracy is not so high. These voltage dividing circuits are difficult to manufacture in such compact integrated circuits as are used in small electronic devices such as electronic watches.

SUMMARY OF THE INVENTION

Therefore, it is an object of the present invention to provide a detecting device for detecting excessive voltage drop in a battery or cell by which the battery excessive discharge is detected in a highly accurate manner.

It is another object of the invention to provide a detecting device for detecting excessive voltage drop of a battery or cell and which consumes very little power.

It is still another object of the invention to provide a voltage drop detecting device having an accurate voltage divider therein for detecting a predetermined voltage drop value.

It is further an object of the invention to provide a very compact voltage detecting device specially suitable for a small electronic instrument such as an electronic watch.

These and other objects are attained using a plurality of MOS transistors having a conductive and non-conductive property far more accurate and dispersionless than resisters or condensers.

DETAILED DESCRIPTION OF THE PREFERRED EMBODIMENTS

Some preferred embodiments of the invention will now be described referring to the attached drawings.

Figure 2:
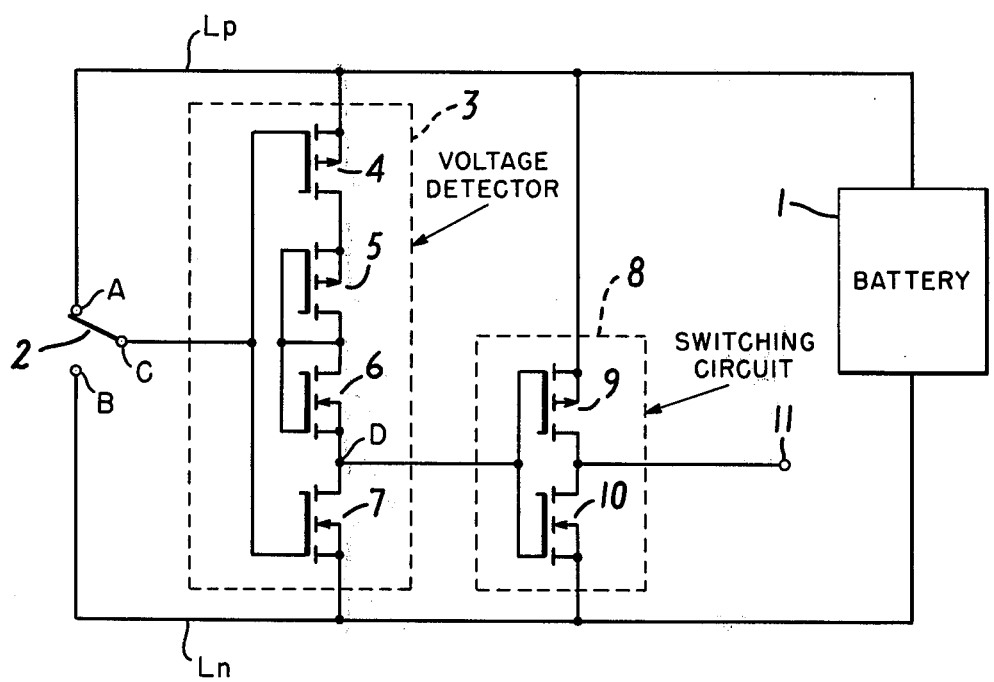
FIG. 2 is a circuit diagram showing an embodiment of the detecting means according to this invention.

Referring first to FIG. 2, reference numeral 1 designates a battery provided in an electronic instrument such as an electronic watch. To the power supplying lines Lp and Ln each of which is connected to a terminal of battery 1, a mechanical switch 2, a voltage detector 3 and a switching circuit 8 are connected in parallel to each other. Mechanical switch 2 has a contact terminal A, which is the normal or neutral terminal as described hereinafter, connected to the positive line Lp of the power supplying lines, a contact terminal B, which is the check or detect terminal, connected to the negative line Ln and a switching movable leaf C switchable between terminals A and B.

Voltage detector 3 comprises a series connection of two P-channel MOS transistors 4 and 5 and of two N-channel MOS transistors 6 and 7, the source of MOS transistor 4 being connected to the positive line Lp, its drain being connected to the source of MOS transistor 5 having its drain, on the other hand, connected to the drain of MOS transistor 6. The source of MOS transistor 6 is connected to the drain of MOS transistor 7 and the source of MOS transistor 7 is connected to the negative line. The gates of MOS transistors 4 and 7 are connected to switching leaf C of mechanical switch 2.

The gates of MOS transistors 5 and 6 are connected to their common drains, and therefore, each of MOS transistors 5 and 6 is to be made conductive in case that the impressed voltage between the source and the drain is greater than its threshold voltage, while, otherwise it is kept non-conductive. An output terminal D is provided in the line between MOS transistor 6 source and MOS transistor 7 drain.

A complementary MOS inverter 8 which acts as a switching circuit is connected at its input terminal to output terminal D of voltage detector 3. Complementary MOS invertor 8 comprises a P-channel MOS transistor 9 and an N-channel MOS transistor 10 interconnected in a complementary connection. The switching circuit 8 has an output terminal 11.

Operation of the above-mentioned embodiment of a detecting means for battery excessive voltage drop according to the invention will be described hereinafter.

Switching leaf C is normally switched to the neutral terminal A during normal operation and when the state of the battery output voltage is not being checked, the terminal A, receiving a voltage of logic level "1". Accordingly, voltage detector 3 is given an input signal of level "1" so that the gates of MOS transistors 4 and 7 assume level "1", making MOS transistor 7 conductive and MOS transistor 4 non-conductive which causes output terminal D to shift into the "0" state. The voltage detector 3 does not dissipate electric power in this state as its output terminal D is at level "0". As a result, MOS transistor 9 in switching circuit 8 becomes conductive, making the output terminal 11 assume logic level "1".

When it is desired to check the battery output voltage, the switching leaf C is switched to terminal B, the leaf C then assumes logic level "0" which is applied as an input to voltage detector 3.

When battery 1 has a higher voltage than a predetermined value $V_1$, MOS transistor 4 is made conductive and accordingly MOS transistor 5 and 6 of voltage detector 3 are also conductive because they are respectively impressed with a voltage higher than their threshold voltage between the source and the drain, while MOS transistor 7 becomes non-conductive. Therefore, output terminal D assumes level "1" and output terminal 11 of switching circuit 8 delivers an "0" level output signal.

If the voltage of battery 1 is lowered to a value lower than the predetermined value VI when the switching leaf C is turned to terminal B, MOS transistor 4 becomes conductive as terminal C shifts to "0" but MOS transistor 5 and 6 cannot change to be conductive, because the voltages impressed on MOS transistors 5 and 6 between the sources thereof are less than the sum of the threshold voltages of MOS transistors 5 and 6. Accordingly, output terminal D of voltage detector 3 gives an "0" level output signal to switching circuit 8 which gives in turn a "1" level output signal on its output terminal 11.

Thus, this device of the embodiment detects lower battery voltage than a predetermined value $V_1$ and therefore approaching battery failure when output terminal 11 shows "1" level, in response to turning switching leaf C of switch 2 to terminal B to apply an "0" level input to voltage detector 3, while the device indicates adequate voltage of the battery when the output terminal 11 shows "0" level.

It is to be noted that in the above embodiment mechanical switch 2 may be, in an electronic watch, replaced with a switching circuit which is switched any time that a driving pulse is not generated for operating the time display, this method serving effective and automatic battery life detection and avoiding high power consumption instances of the time display operation.

It is further to be noted that a pair of P-channel MOS transistor 5 and N-channel MOS transistor 6 is advantageous for attaining an accurate and dispersionless summing value of the two threshold voltages, cancelling harmful effects of contamination imparted to the transistors in the fabrication process.

A second embodiment of the invention will be described hereinafter according to FIG. 3 in which the reference numerals and marks corresponding to those in FIG. 2 denotes similar parts.

Figure 3:
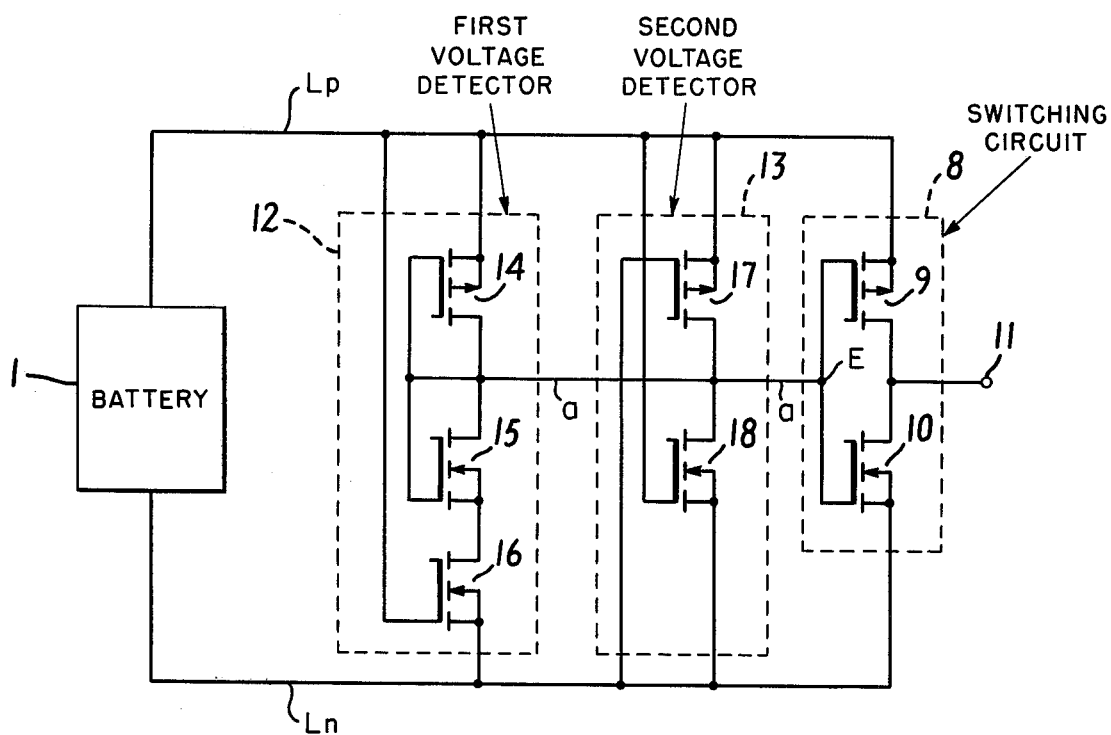
FIG. 3 is a circuit diagram showing a second embodiment of the detecting means according to the invention.

Numeral 12 in FIG. 3 designates a first voltage detector connected between positive line Lp and negative line Ln, parallel with a second voltage detector 13 and a switching circuit 8.

First voltage detector 12 has a P-channel MOS transistor 14 and two N-channel MOS transistors 15 and 16 which are connected in series to each other, the source of MOS transistor 14 being connected to the positive line Lp, its drain being connected to the drain of MOS transistor 15 those source is, on the other hand, connected to the drain of MOS transistor 16, and the source of MOS transistor 16 being connected to the negative line Ln. The gates of MOS transistor 14 and 15 are interconnected to each other and to the drains of the same transistors. The gate of MOS transistor 16 is connected to the positive line Lp.

Second voltage detector 13 has a P-channel MOS transistor 17 and an N-channel MOS transistor 18 which are connected to each other in series, the source of MOS transistor 17 being connected to the positive line Lp, its drain being connected to the drain of MOS transistor 18 and its source being connected to the negative line Ln. The gate of MOS transistor 17 is connected to the negative line, while the gate of MOS transistor 18 is connected to the positive line.

These MOS transistors 17 and 18 have rather higher conductive resistances than those of MOS transistors 14, 15 and 16.

The gates of MOS transistors 9 and 10 are connected as shown with mark "a", to the drains of MOS transistors 17 and 18 in second voltage detector 13 and to the drains of MOS transistors 14 and 15 in first voltage detector 12.

In operation of the above detecting device, while battery 1 is in the normal charged state having higher output voltage than a predetermined value V1, switching circuit 8 receives a "1" level input signal at the input terminal E in line "a", the input level being significantly higher than half of the battery voltage which results from the voltage division caused by conductive resistances of MOS transistors 14, 15 and 16 in first voltage detector 12 and those of MOS transistors 17 and 18, as each of these MOS transistors is made conductive in its gate state. Accordingly, MOS transistor 10 of switching circuit 8 is made conductive shifting its output 11 to "0" level.

When the voltage of battery 1 discharges to a value lower than the predetermined value $V_1$, MOS transistors 14 and 15 of first voltage detector 12 are immediately made non-conductive, as the voltage between the source of the MOS transistor 14 and that of the MOS transistor 15 becomes lower than the sum of the threshold voltages thereof. Therefore, the input voltage at E of switching circuit 8 is shifted approximately equal to a voltage divided with the conductive resistances of MOS transistors 17 and 18 of the second voltage detector 13. Thus, the input voltage at E becomes suddenly approximately half voltage of that of battery 1. As the threshold voltage of switching circuit 8 is set to half of the battery voltage, the input voltage decrease at E till half of the battery voltage makes the input of E assume level "0". The input of "0" level at E makes MOS transistor 9 conductive and output 11 becomes, in response, shifted to level "1".

Figure 4:
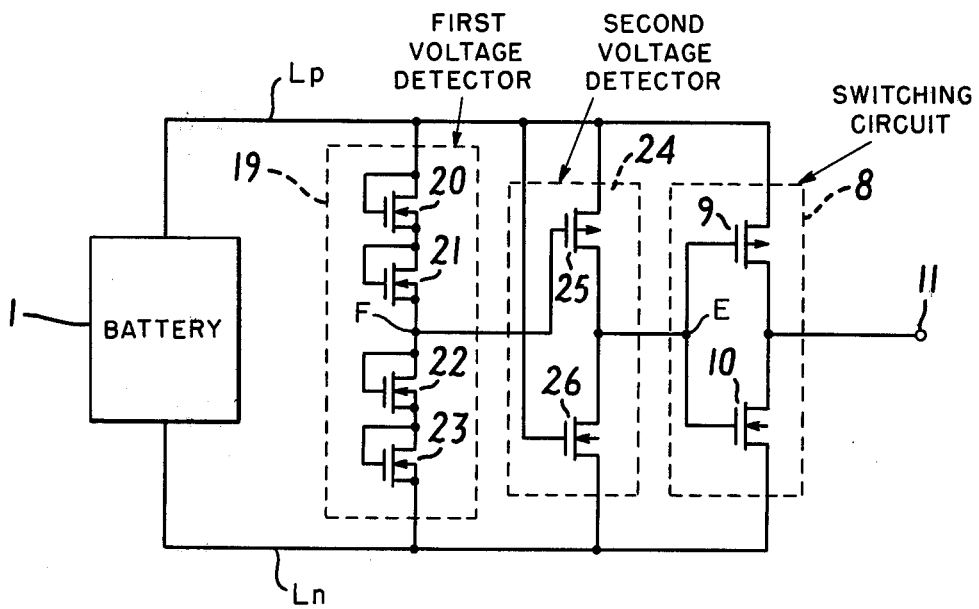
FIG. 4 is a circuit diagram showing another embodiment of the detecting means according to the invention.

A still further embodiment is shown in FIG. 4, in which a first voltage detector 19 is provided between positive line Lp and negative line Ln, said first voltage detector 19 having a plurality of N-channel MOS transistors 20, 21, 22 and 23 interconnected in series to each other. In each of the N-channel MOS transistors 20, 21, 22 and 23, the gate is connected with the drain. To the output terminal F of first voltage detector 19 there is connected a second voltage detector 24 which has a P-channel MOS transistor 25 and an N-channel MOS transistor 26. The gate of MOS transistor 25 is connected to the output terminal F of first voltage detector, while the gate of MOS transistor 26 is connected to the positive line Lp. Both of the drains of MOS transistors 25 and 26 are connected with each other and to the input terminal E of a switching circuit 8, while the source of MOS transistor 25 is connected to positive line Lp, the source of MOS transistor 26 being connected to negative line Ln.

Switching circuit 8 is similar in construction as the aforementioned circuit in first or second embodiment.

Figure 1:
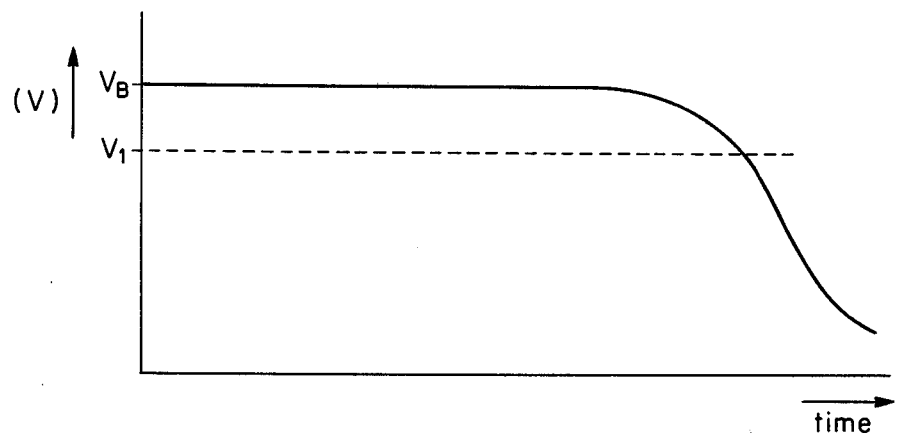
FIG. 1 is a characteristic graph representing the voltage-time property of a usual battery or cell.

In operation of this third embodiment, when battery 1 has voltage far higher than voltage value $V_1$ in FIG. 1, all of the MOS transistors 20, 21, 22 and 23 in first voltage detector 19 are conductive, each of the transistors acting as a resistance. Therefore, the voltage divided with dividing ratio V at output terminal F is at a high level. If the battery voltage is lowered so as to make the impressed voltage on each of MOS transistors 20, 21, 22 and 23 lower than its threshold voltage, all of the MOS transistors 20, 21, 22 and 23 become non-conductive. Each of the MOS transistors 20, 21, 22 and 23 acting, in this state, as a capacitor so that the dividing ratio V does not change. Therefore, the divided voltage at F is still kept at a high level.

The high level output voltage at F makes MOS transistor 25 in the second voltage detector 24 non-conductive, while MOS transistor 26 is conductive. Therefore, the output of second voltage detector 24 at E is at level "0", which makes switching circuit 8 produce a level "1" at the output terminal 11.

Further battery voltage drop lowers the output voltage at F of the first voltage detector 19 proportionally. When the battery voltage reaches voltage value $V_1$ in FIG. 1, the output voltage at F becomes lower than the threshold voltage of MOS transistor 25. Accordingly, MOS transistor 25 is shifted to be conductive, and the conductive resistance of MOS transistor 26 increases, making the output level at E at logic level "1". As a result, the output at 11 of switching circuit 8 is changed to level "0" which indicates excessive voltage discharge of the battery and the need for replacement of the battery.

What I claim is:

1. A detecting device for detecting the output voltage of a battery or cell comprising: voltage detecting means connectable to a battery whose output voltage is to be detected and including at least a pair of MOS transistors connected in a series such that at least one of said MOS transistors shifts to its conducting state in response to the battery output voltage falling below a predetermined value thereby providing one output signal indicative of adequate battery output voltage and shifts to its nonconducting state in response to the battery output voltage being above said predetermined value thereby providing another output signal indicative of unacceptably low battery output voltage; and a switching circuit comprised of a complementary MOS inverter connected to receive the output signals derived from said voltage detecting means and operative to switch states in response thereto to provide corresponding inverted output signals indicative of the battery output voltage level.

2. A detecting device according to claim 1; including switching means connected to said voltage detecting means for selectively switching said voltage detecting means to the battery whose voltage is to be detected.

3. A detecting device according to claim 1; wherein said voltage detecting means comprises a first voltage detector stage comprised of a series connection of MOS transistors and a second voltage detector stage connected to said first voltage detector stage and comprised of a series connection of said pair of MOS transistors, the conductive resistances of said pair of MOS transistors of said second voltage detector stage being higher than that of said MOS transistors of said first voltage detector stage.

4. A detecting device according to claim 1; wherein said voltage detecting means includes means for amplifying the output signals produced by said voltage detecting means.

5. A detecting device according to claim 1; wherein said voltage detecting means includes a common output terminal to which is applied the output signals produced by said voltage detecting means; and means connecting said output terminal to the input side of said complementary MOS inverter.

* * * * *

UNITED STATES PATENT AND TRADEMARK OFFICE
CERTIFICATE OF CORRECTION

PATENT NO. : 4024415
DATED : May 17, 1977
INVENTOR(S) : Yoshiaki Matsuura

It is certified that error appears in the above-identified patent and that said Letters Patent are hereby corrected as shown below:

In the heading of the patent, beneath item 76 listing the inventor, insert:

--[73] Assignee: Kabushiki Kaisha Daini Seikosha, Japan--

Signed and Sealed this

Fifteenth Day of November 1977

[SEAL]

Attest:

RUTH C. MASON
Attesting Officer

LUTRELLE F. PARKER
Acting Commissioner of Patents and Trademarks

UNITED STATES PATENT AND TRADEMARK OFFICE
CERTIFICATE OF CORRECTION

PATENT NO. : 4,024,415
DATED : May 17, 1977
INVENTOR(S) : Yoshiaki MATSUURA

It is certified that error appears in the above-identified patent and that said Letters Patent are hereby corrected as shown below:

In the Heading of the Patent, Item [30] change:

Dec. 24, 1974   Japan   .................. 49-4090

Dec. 24, 1974   Japan   .................. 49-4091 to

--Dec. 24, 1974   Japan   .................. 50-4090

Dec. 24, 1974   Japan   .................. 50-4091--.

Signed and Sealed this

Fourth Day of July 1978

[SEAL]

Attest:

RUTH C. MASON
Attesting Officer

DONALD W. BANNER
Commissioner of Patents and Trademarks